(12) United States Patent
Tang (10) Patent No.: US 11,557,565 B2
(45) Date of Patent: Jan. 17, 2023

(54) SEMICONDUCTOR DEVICE ASSEMBLY AND METHOD THEREFOR

(71) Applicant: NXP USA, INC., Austin, TX (US)

(72) Inventor: Jinbang Tang, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 112 days.

(21) Appl. No.: 17/063,763

(22) Filed: Oct. 6, 2020

(65) Prior Publication Data

US 2022/0108973 A1 Apr. 7, 2022

(51) Int. Cl.
*H01L 23/00* (2006.01)
*H01L 23/495* (2006.01)

(52) U.S. Cl.
CPC ........ *H01L 24/73* (2013.01); *H01L 23/49513* (2013.01); *H01L 24/24* (2013.01); *H01L 24/32* (2013.01); *H01L 24/82* (2013.01); *H01L 24/92* (2013.01); *H01L 2224/24011* (2013.01); *H01L 2224/2413* (2013.01); *H01L 2224/24051* (2013.01); *H01L 2224/24246* (2013.01); *H01L 2224/32245* (2013.01); *H01L 2224/73227* (2013.01); *H01L 2224/73265* (2013.01); *H01L 2224/73267* (2013.01); *H01L 2224/82101* (2013.01); *H01L 2224/9201* (2013.01); *H01L 2224/92137* (2013.01); *H01L 2224/92244* (2013.01)

(58) Field of Classification Search
CPC ......... H01L 24/73; H01L 24/24; H01L 24/82; H01L 24/94; H01L 23/49513
See application file for complete search history.

(56) References Cited

U.S. PATENT DOCUMENTS

| | | |
|---|---|---|
| 5,019,946 A | 5/1991 | Eichelberger et al. |
| 5,600,183 A | 2/1997 | Gates, Jr. |
| 5,640,760 A | 6/1997 | Val et al. |
| 6,140,581 A | 10/2000 | Cowan et al. |
| 6,420,208 B1 | 7/2002 | Pozder et al. |
| 7,243,421 B2 | 7/2007 | Bentley et al. |
| 7,829,997 B2 | 11/2010 | Hess et al. |
| 7,838,420 B2 | 11/2010 | Tang et al. |
| 7,838,979 B2 | 11/2010 | Oh |
| 7,972,650 B1 | 7/2011 | Church et al. |
| 8,216,918 B2 | 7/2012 | Gong et al. |
| 8,263,434 B2 | 9/2012 | Pagaila et al. |
| 8,513,767 B2 | 8/2013 | Kotlanka et al. |
| 8,647,979 B2 | 2/2014 | Yaniv et al. |
| 8,900,921 B2 | 12/2014 | Kim et al. |
| 9,202,792 B2 | 12/2015 | Yu et al. |
| 9,331,029 B2 | 5/2016 | Vincent et al. |
| 9,935,079 B1 | 4/2018 | Foong et al. |

(Continued)

OTHER PUBLICATIONS

3DiS Technologies, Fact Sheet, Apr. 2019.

(Continued)

*Primary Examiner* — Jasmine J Clark (57) ABSTRACT

A method of forming a semiconductor device includes attaching a semiconductor die to a flag of a leadframe and forming a conductive connector over a portion of the semiconductor die and a portion of the flag. A conductive connection between a first bond pad of the semiconductor die and the flag is formed by way of the conductive connector. A second bond pad of the semiconductor die is connected to a conductive lead of the plurality by way of a bond wire.

20 Claims, 7 Drawing Sheets

(56) References Cited

U.S. PATENT DOCUMENTS

| | | |
|---|---|---|
| 2002/0105073 A1 | 8/2002 | Smith |
| 2005/0062171 A1 | 3/2005 | Hung |
| 2011/0012246 A1 | 1/2011 | Andrews, Jr. et al. |
| 2011/0024888 A1 | 2/2011 | Pagaila et al. |
| 2011/0037159 A1 | 2/2011 | McElrea et al. |
| 2011/0068444 A1 | 3/2011 | Chi et al. |
| 2012/0032340 A1 | 2/2012 | Choi et al. |
| 2012/0329212 A1 | 12/2012 | Leal |
| 2015/0049421 A1* | 2/2015 | Paek ............... H01L 23/16 361/676 |
| 2015/0163904 A1 | 6/2015 | Karhade et al. |
| 2015/0200177 A1 | 7/2015 | Foong et al. |
| 2015/0249043 A1 | 9/2015 | Elian et al. |
| 2015/0262931 A1 | 9/2015 | Vincent et al. |
| 2015/0328835 A1 | 11/2015 | Wu et al. |
| 2016/0093525 A1 | 3/2016 | Cook et al. |
| 2016/0099231 A1 | 4/2016 | Yang et al. |
| 2016/0190047 A1 | 6/2016 | Cahill et al. |

OTHER PUBLICATIONS

Optomec, "Aerosol Jet 300 Series Systems for Development of Printed Electronics and Biologies", Apr. 2017.

Paulsen, J., "Printing Conformal Electronics on 3D Structures with Aerosol Jet Technology", 2012 Future of Instrumentation International Workshop (FIIW) Proceedings, Oct. 2012.

Vincent, M., "Heterogeneous Sensor System in Package (SSiP) Integration using Wafer-Level Molding", SRC Project Update, Aug. 2020.

U.S. Appl. No. 17/095,111, filed Nov. 11, 2020, entitled "Semiconductor Device Assembly and Method Therefor".

No-final office action dated Feb. 18, 2022 in U.S. Appl. No. 17/095,111.

Notice of Allowance dated Jun. 30, 2022 in U.S. Appl. No. 17/095,111.

* cited by examiner

SEMICONDUCTOR DEVICE ASSEMBLY AND METHOD THEREFOR

BACKGROUND

Field

This disclosure relates generally to semiconductor devices, and more specifically, to semiconductor device assembly and method of forming the same.

Related Art

Semiconductor devices are often found in a large spectrum of electronic products—from sewing machines to washing machines, from automobiles to cellular telephones, and so on. Such semiconductor devices generally include an integrated circuit die which communicates with the other devices outside of a package by way of bond wires, for example. As technology progresses, semiconductor manufacturing continues to seek ways to reduce costs and improve performance and reliability in these semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device including a conductive connector formed between a bond pad on a semiconductor die and a flag of the device leadframe. Connecting the bond pad to the flag by way of the conductive connector allows for a ground voltage to be provided to the semiconductor die without using a bond wire, for example. Because ground connections can be made in this manner, an increased number of ground connections can be made without negatively impacting the number of conductive leads of the device. With the increased number of ground connections, inductance generally associated with bond wire connections is reduced resulting in less noise and improved high frequency performance.

Figure 1:
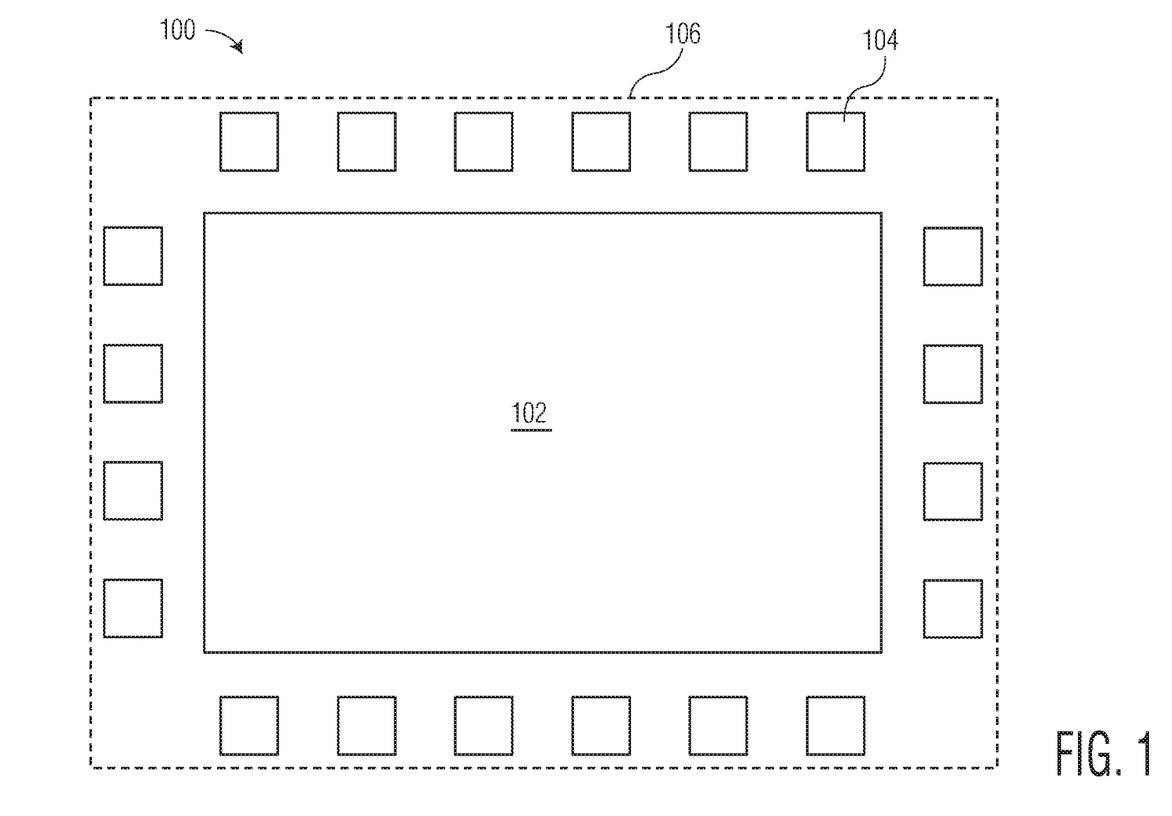
FIG. 1 illustrates, in a simplified plan view, a leadframe for an example semiconductor device at a stage of manufacture in accordance with an embodiment.

FIG. 1 illustrates, in a simplified plan view, a leadframe 100 for an example semiconductor device at a stage of manufacture in accordance with an embodiment. As depicted in FIG. 1, the leadframe 100 includes a flag 102 and a plurality of conductive leads 104 formed around the perimeter of the flag 102. The leadframe 100 may be formed from any suitable electrically conductive material, such as aluminum, copper, silver, nickel, or iron, or alloys thereof, for example. The conductive metal may be bare, partially plated, or plated with another metal or an alloy such as iron/nickel alloy, silver, gold, copper, or the like. A dashed outline label 106 indicates an outer perimeter location of an encapsulant formed at a subsequent stage of manufacture. Features of the leadframe 100 such at tie bars, dam bars, and the like are not shown for illustration purposes. In this embodiment, the leadframe 100 is characterized as a quad flat no-lead (QFN) type package leadframe.

The flag 102 may be formed having any shape, size, or configuration suitable for an attachment of a semiconductor die. In this embodiment, the flag 102 and the plurality of leads 104 are formed in the same plane. The plurality of leads 104 are configured and arranged to couple electrical signals between locations from outside of a finished semiconductor device package and locations within the package such as bond pads on a semiconductor die, for example.

Figure 2:
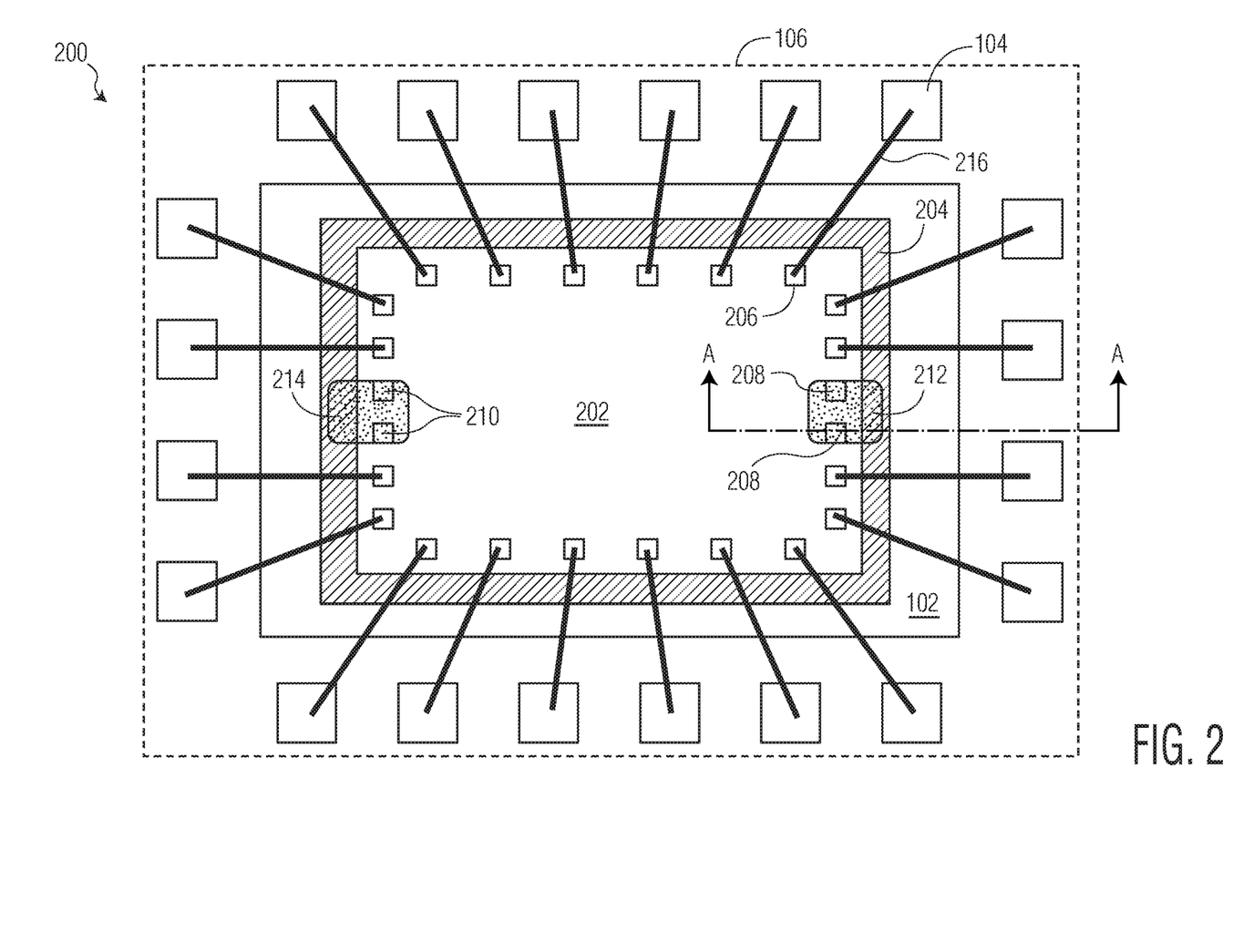
FIG. 2 illustrates, in a simplified plan view, an example semiconductor device at a stage of manufacture in accordance with an embodiment.
Figure 3:
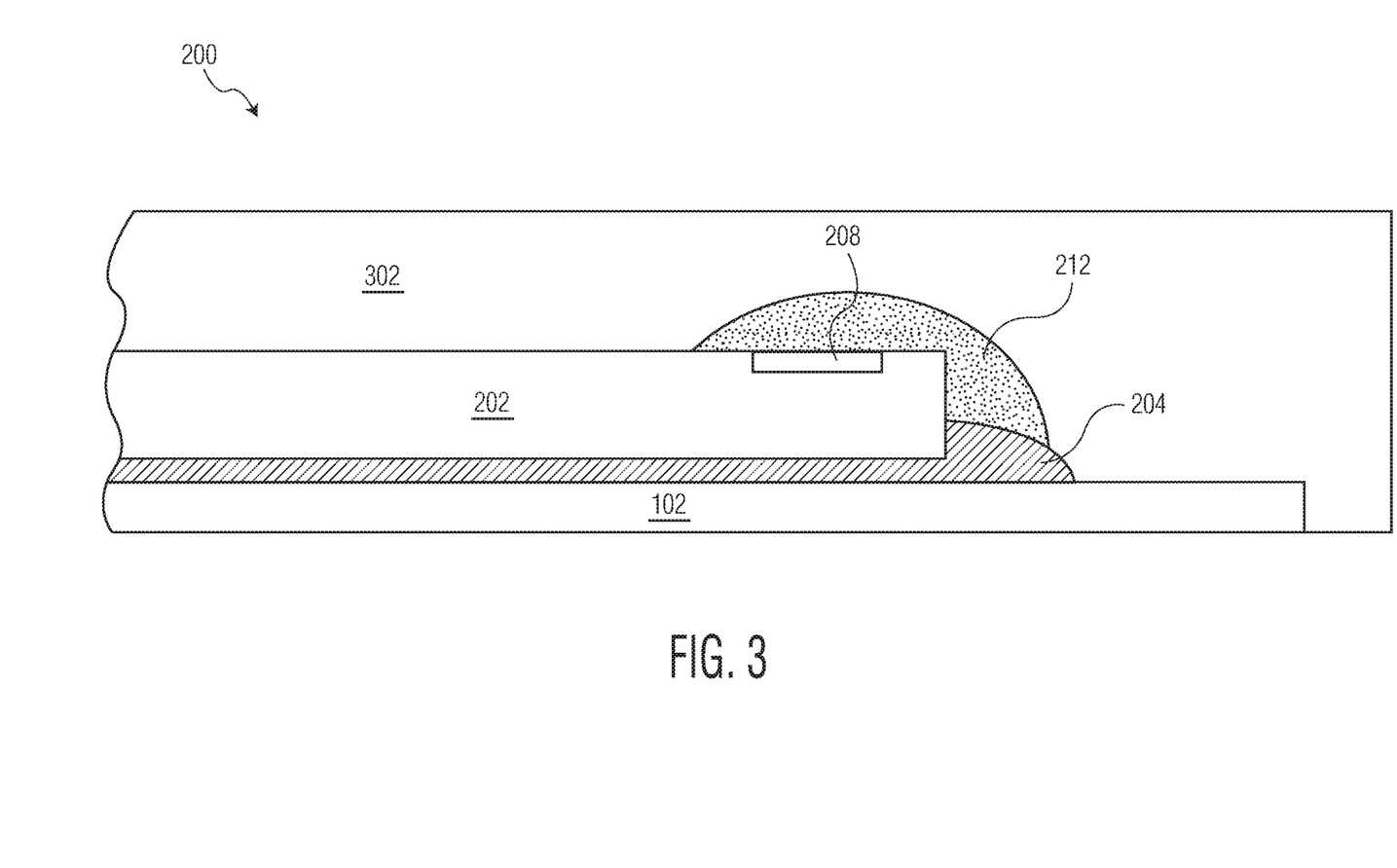
FIG. 3 illustrates, in a simplified cross-sectional view, an example conductive connector in accordance with an embodiment.

FIG. 2 illustrates, in a simplified plan view, an example semiconductor device 200 at a stage of manufacture in accordance with an embodiment. At this stage, the device 200 includes a semiconductor die 202 attached to the flag 102. In this embodiment, a backside surface of the semiconductor die 202 is attached to the flag 102 by way of a conductive die attach material 204 (e.g., conductive epoxy, solder paste). The die attach material 204 is disposed between the semiconductor die 202 and the flag 102. A portion of the die attach material 204 extends outward on the flag 102 beyond the perimeter of the semiconductor die 202. A plurality of bond pads 206 at an active surface of the semiconductor die 202 are connected to the plurality of conductive leads 104 by way of respective bond wires 216. A cross-sectional view of the device 200 taken along line A-A is shown in FIG. 3.

The semiconductor die 202 includes core circuitry substantially surrounded by the plurality of bond pads 206 at the active surface of the die. In this embodiment, the core circuitry may include any type of circuits and functional blocks or combinations thereof such as a processors, memory, timer, serial communication unit, analog circuitry, RF circuitry, sensors, and others. The bond pads 206 are located around the perimeter of the semiconductor die 202 and are configured for connection to the plurality of conductive leads 104 by way of the bond wires 216. The bond wires 216 may be formed from a suitable metal material such as aluminum, copper, silver, or gold. In this embodiment, the bond pads 208 and 210 are characterized as ground bond pads configured for connection to a ground voltage supply. The flag 102 is configured for connection to a ground voltage supply thus providing a ground voltage connection to the semiconductor die 202 by way of the conductive connectors 212 and 214 when the device 200 is mounted on a printed circuit board, for example.

Conductive connectors 212 and 214 are formed over a portion of the semiconductor die 202 and a portion of the flag 102. The conductive connectors 212 and 214 are formed directly contacting respective bond pads 208 and 210 of the semiconductor die 202 and directly contacting the extended portion of the conductive die attach material 204. The conductive connectors 212 and 214 may be formed by way of a dispensing, jetting, or 3-D printing process, for example. In one embodiment, the die attach material 204 may be formed from a solder paste material having a relatively high reflow temperature and the conductive connectors 212 and 214 may be formed from a dispensed solder paste material having a relatively low reflow temperature (e.g., lower than the die attach material 204). In one embodiment, the conductive connectors 212 and 214 may be formed as printed connections between bond pads 208 and 210 and the die attach material 204 by way of conductive 3-D printing.

Because the ground pads 208 and 210 can be supplied by way of the conductive connectors 212 and 214, for example, an increased number of ground connections can be made without negatively impacting the number of conductive leads 104. With the ground voltage supplied to the semiconductor die 202 in this manner, inductance generally associated with bond wire connections is reduced resulting in less noise and improved high frequency performance. Further, by supplying a ground voltage to the semiconductor die 202 from the flag 102, conductive leads normally dedicated for ground supplies can be eliminated (e.g., to reduce package size) or replaced with other signals (e.g., to enhance performance or functionality).

FIG. 3 illustrates, in a simplified cross-sectional view, the example conductive connector 212 of device 200 taken along line A-A of FIG. 2 in accordance with an embodiment. As illustrated in FIG. 3, the backside surface of the semiconductor die 202 is attached to the flag 102 by way of the conductive die attach material 204. A first portion of the die attach material 204 is disposed between the semiconductor die 202 and the flag 102 and a second portion of the die attach material 204 extends outward on the flag 102 beyond the perimeter edge of the semiconductor die 202. The bond pad 208 located at the active surface of the semiconductor die 202 is conductively connected to the flag 102 by way of the conductive connector 212 and die attach material 204. For example, the conductive connector 212 is formed directly contacting the bond pad 208 of the semiconductor die 202 and directly contacting the extended portion of the conductive die attach material 204. As illustrated in FIG. 3, the encapsulant (e.g., epoxy material) 302 is shown encapsulating the semiconductor die 202, exposed portion of the flag 102, exposed portion of the die attach material 204, and the conductive connector 212.

Figure 4:
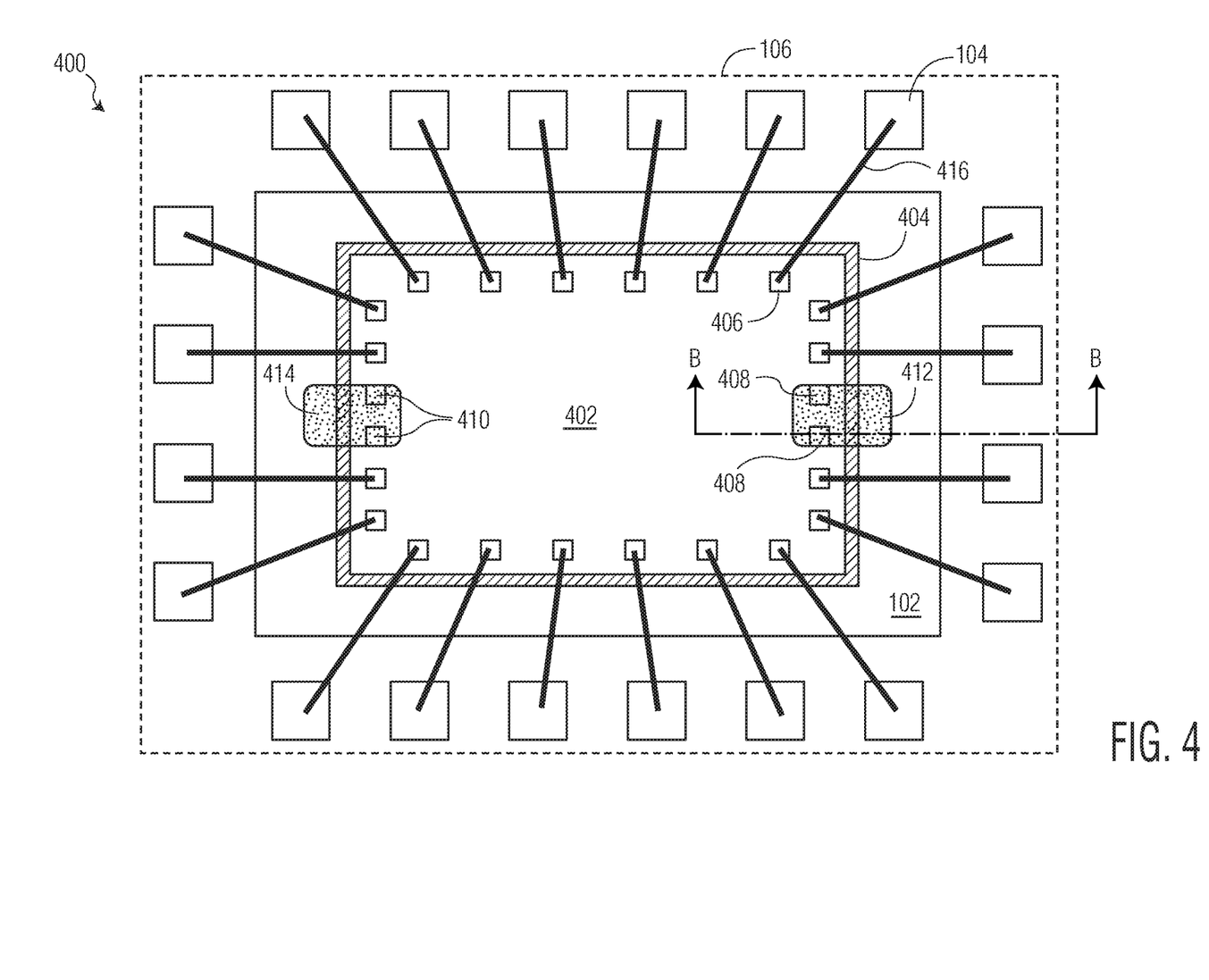
FIG. 4 illustrates, in a simplified plan view, an alternative example semiconductor device at a stage of manufacture in accordance with an embodiment.
Figure 5:
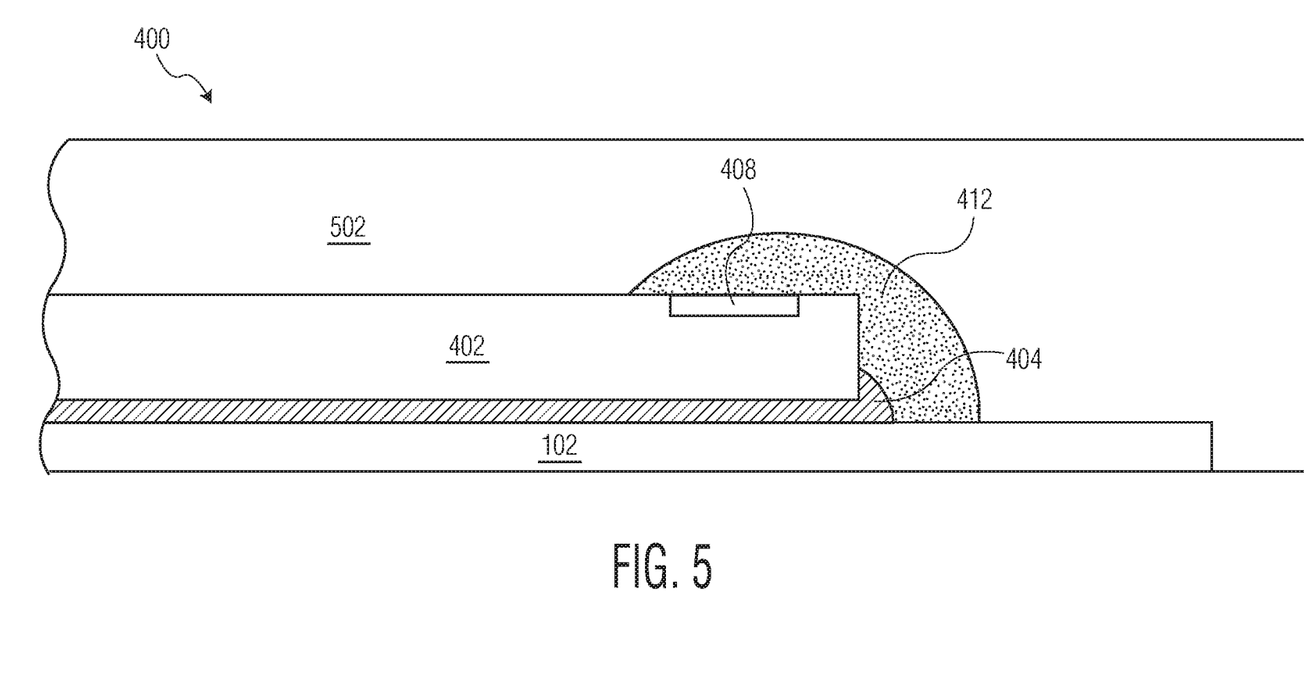
FIG. 5 illustrates, in a simplified cross-sectional view, an alternative example conductive connector in accordance with an embodiment.

FIG. 4 illustrates, in a simplified plan view, an alternative example semiconductor device 400 at a stage of manufacture in accordance with an embodiment. At this stage, the device 400 includes a semiconductor die 402 attached to the flag 102 by way of a die attach material 404. In this embodiment, die attach material 404 may be formed from a non-conductive material (e.g., non-conductive epoxy) or may be formed from a conductive material (e.g., conductive epoxy, solder paste). The die attach material 404 is disposed between the semiconductor die 402 and the flag 102. A small portion of the die attach material 404 may extend beyond the perimeter of the semiconductor die 402. A plurality of bond pads 406 at an active surface of the semiconductor die 402 are connected to the plurality of conductive leads 104 by way of respective bond wires 416. A cross-sectional view of the device 400 taken along line B-B is shown in FIG. 5.

The semiconductor die 402 includes core circuitry substantially surrounded by the plurality of bond pads 406 at the active surface of the die. The bond pads 406 are located around the perimeter of the semiconductor die 402 and are configured for connection to the plurality of conductive leads 104 by way of the bond wires 416. In this embodiment, the bond pads 408 and 410 are characterized as ground bond pads configured for connection to a ground voltage supply. The flag 102 is configured for connection to a ground voltage supply thus providing a ground voltage connection to the semiconductor die 402 by way of the conductive connectors 412 and 414 when the device 400 is mounted on a printed circuit board, for example.

The conductive connectors 412 and 414 are formed over a portion of the semiconductor die 402 and a portion of the flag 102. The conductive connectors 412 and 414 are formed directly contacting respective bond pads 408 and 410 of the semiconductor die 402 and directly contacting the flag 102. The conductive connectors 412 and 414 may be formed by way of a dispensing, jetting, or 3-D printing process, for example. In one embodiment, the conductive connectors 412 and 414 may be formed from a dispensed solder paste material and reflowed to form conductive connections between the bond pads 408 and 410 and the flag 102. In one embodiment, the conductive connectors 412 and 414 may be formed as printed connections between bond pads 408 and 410 and the flag 102 by way of conductive 3-D printing.

Because the ground pads 408 and 410 can be supplied by way of the conductive connectors 412 and 414, for example, an increased number of ground connections can be made without negatively impacting the number of conductive leads 104. With the ground voltage supplied to the semiconductor die 402 in this manner, inductance generally associated with bond wire connections is reduced resulting in less noise and improved high frequency performance. Further, by supplying a ground voltage to the semiconductor die 402 from the flag 102, conductive leads normally dedicated for ground supplies can be eliminated (e.g., to reduce package size) or replaced with other signals (e.g., to enhance performance or functionality).

FIG. 5 illustrates, in a simplified cross-sectional view, the example conductive connector 412 of device 400 taken along line B-B of FIG. 4 in accordance with an embodiment. As illustrated in FIG. 5, the backside surface of the semiconductor die 402 is attached to the flag 102 by way of the die attach material 404. The die attach material 404 is disposed between the semiconductor die 402 and the flag 102. A small portion of the die attach material 404 may extend outward on the flag 102 slightly beyond the perimeter edge of the semiconductor die 402. The bond pad 408 located at the active surface of the semiconductor die 402 is conductively connected to the flag 102 by way of the conductive connector 412. For example, the conductive connector 412 is formed directly contacting the bond pad 408 of the semiconductor die 402 and directly contacting the flag 102. As illustrated in FIG. 5, the encapsulant 502 is shown encapsulating the semiconductor die 402, exposed portion of the flag 102, and the conductive connector 412.

Figure 6:
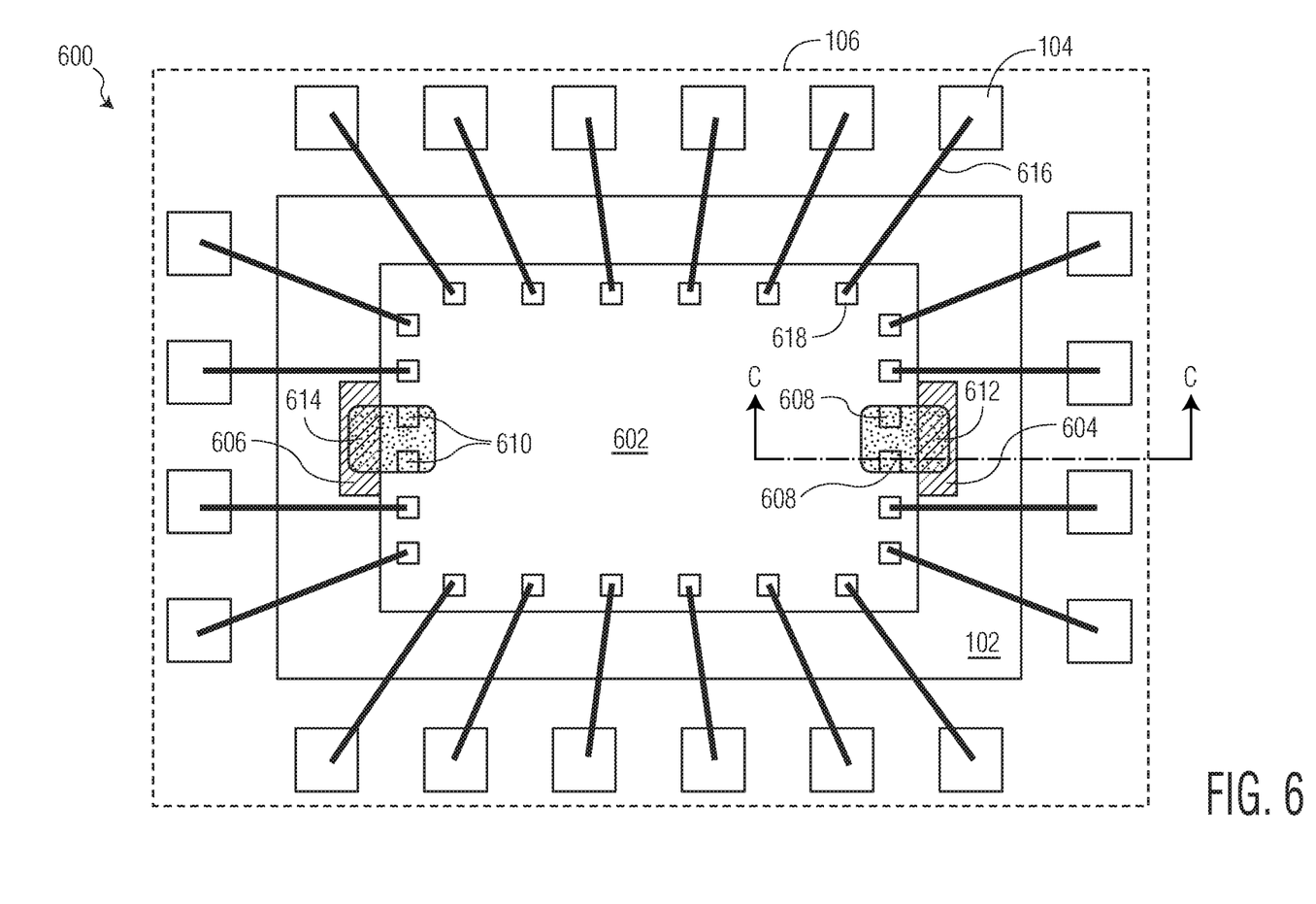
FIG. 6 illustrates, in a simplified plan view, another alternative example semiconductor device at a stage of manufacture in accordance with an embodiment.
Figure 7:
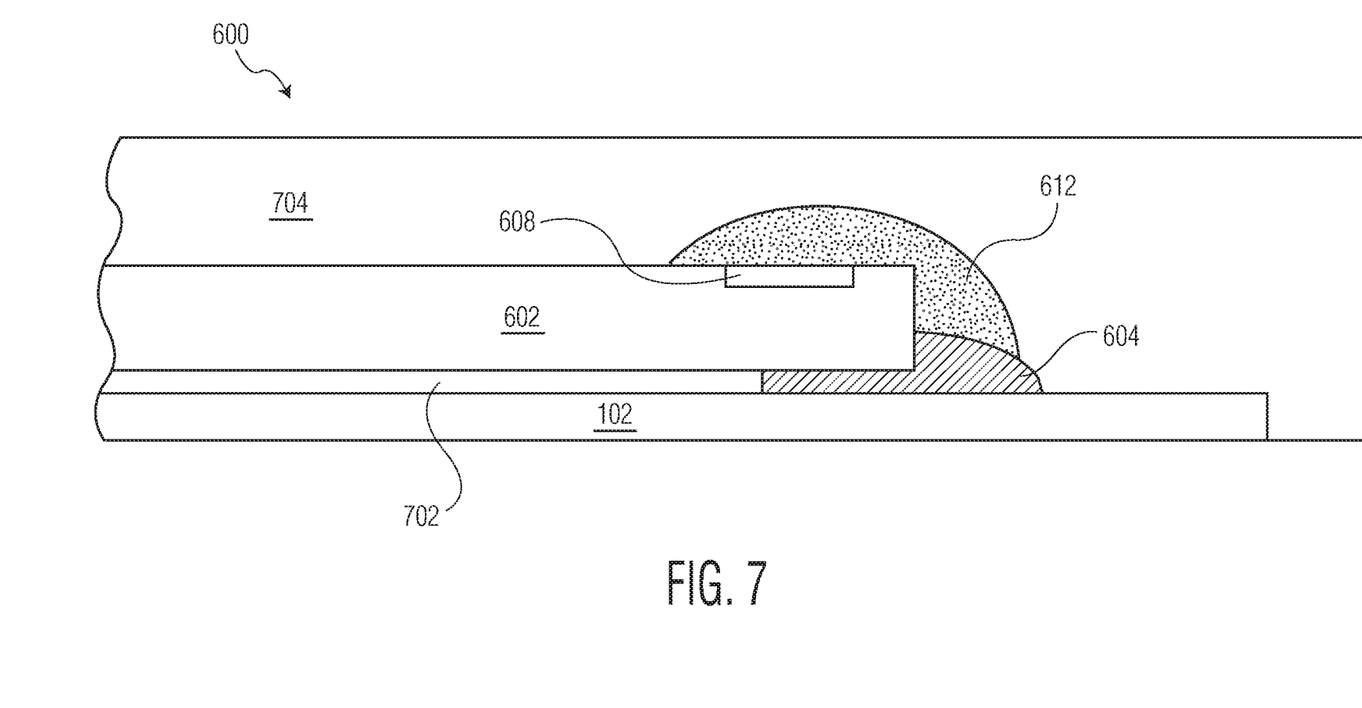
FIG. 7 illustrates, in a simplified cross-sectional view, another alternative example conductive connector in accordance with an embodiment.

FIG. 6 illustrates, in a simplified plan view, an alternative example semiconductor device 600 at a stage of manufacture in accordance with an embodiment. At this stage, the device 600 includes a semiconductor die 602 attached to the flag 102 and conductive connectors 612 and 614 formed to connect bond pad 608 and 610 to respective conductive fillets 604 and 606. The semiconductor die 602 is attached to the flag 102 by way of a die attach material (e.g., die attach material 702 in FIG. 7) disposed between the semiconductor die 602 and the flag 102. In one embodiment, die attach material may be formed from a non-conductive material (e.g., non-conductive epoxy). In one embodiment, die attach material may be formed from a conductive material (e.g., conductive epoxy, solder paste). A plurality of bond pads 618 at an active surface of the semiconductor die 602 are connected to the plurality of conductive leads 104 by way of respective bond wires 616. A cross-sectional view of the device 600 taken along line C-C is shown in FIG. 7.

The semiconductor die 602 includes core circuitry substantially surrounded by the plurality of bond pads 618 at the active surface of the die. The bond pads 618 are located around the perimeter of the semiconductor die 602 and are configured for connection to the plurality of conductive leads 104 by way of the bond wires 616. In this embodiment, the bond pads 608 and 610 are characterized as ground bond pads configured for connection to a ground voltage supply. The flag 102 is configured for connection to a ground voltage supply thus providing a ground voltage connection to the semiconductor die 602 by way of the conductive connectors 612 and 614 when the device 600 is mounted on a printed circuit board, for example.

The conductive connectors 612 and 614 are formed over a portion of the semiconductor die 602 and a portion of the flag 102. The conductive connectors 612 and 614 are formed directly contacting respective bond pads 608 and 610 of the semiconductor die 602 and directly contacting the conductive fillets 604 and 606. The conductive fillets 604 and 606 and the conductive connectors 612 and 614 may be formed by way of a dispensing, jetting, or 3-D printing process, for example. In one embodiment, the conductive fillets 604 and 606 may be formed from a dispensed solder paste material having a relatively high reflow temperature and the conductive connectors 612 and 614 may be formed from a dispensed solder paste material having a relatively low reflow temperature (e.g., lower than the die attach material 604). In one embodiment, the conductive connectors 612 and 614 may be formed as printed connections between bond pads 608 and 610 and the conductive fillets 604 and 606 by way of conductive 3-D printing.

Because the ground pads 608 and 610 can be supplied by way of the conductive connectors 612 and 614, for example, an increased number of ground connections can be made without negatively impacting the number of conductive leads 104. With the ground voltage supplied to the semiconductor die 602 in this manner, inductance generally associated with bond wire connections is reduced resulting in less noise and improved high frequency performance. Further, by supplying a ground voltage to the semiconductor die 602 from the flag 102, conductive leads normally dedicated for ground supplies can be eliminated (e.g., to reduce package size) or replaced with other signals (e.g., to enhance performance or functionality).

FIG. 7 illustrates, in a simplified cross-sectional view, the example conductive connector 612 of device 600 taken along line C-C of FIG. 6 in accordance with an embodiment. As illustrated in FIG. 7, the backside surface of the semiconductor die 602 is attached to the flag 102 by way of the die attach material 702. The die attach material 702 is disposed between the semiconductor die 602 and the flag 102. The conductive fillet 604 is formed adjacent to the perimeter edge of the semiconductor die 602 to flag 102 transition. In some embodiments, a small portion of the conductive fillet 604 may extend under the die edge. The bond pad 608 located at the active surface of the semiconductor die 602 is conductively connected to the flag 102 by way of the conductive connector 612 and the conductive fillet 604. For example, the conductive connector 612 is formed directly contacting the bond pad 608 of the semiconductor die 602 and directly contacting the conductive fillet 604. As illustrated in FIG. 7, the encapsulant 704 is shown encapsulating the semiconductor die 602, exposed portion of the flag 102, exposed portion of the conductive fillet 604, and the conductive connector 612.

Generally, there is provided, a semiconductor device including a leadframe having a plurality of conductive leads and a flag; a semiconductor die attached to the flag of the leadframe; a conductive connector applied over a portion of the semiconductor die and a portion of the flag, a conductive connection between a first bond pad of the semiconductor die and the flag formed by way of the conductive connector; and a second bond pad of the semiconductor die connected to a conductive lead of the plurality by way of a bond wire. The semiconductor device may further include a die attach material disposed between the semiconductor die and the flag. The die attach material may be characterized as a conductive die attach material having a melting point. The conductive connector may be characterized as a solder-based material having a melting point lower than the melting point of the die attach material. A portion of the die attach material may extend beyond the perimeter of the semiconductor die, the conductive connector directly contacting the die attach material. The semiconductor device may further include a conductive fillet formed at the semiconductor die to flag transition, the conductive connector directly contacting the conductive fillet. The conductive fillet may be formed from a material different from the die attach material. The conductive connector applied over the portion of the semiconductor die and the portion of the flag may be formed by way of a 3-D printing process. The leadframe may be characterized as a quad flat no-lead (QFN) type package leadframe.

In another embodiment, there is provided, a method including attaching a semiconductor die to a flag of a leadframe; forming a conductive connector over a portion of the semiconductor die and a portion of the flag, a conductive connection between a first bond pad of the semiconductor die and the flag formed by way of the conductive connector; and connecting by way of a bond wire a second bond pad of the semiconductor die to a conductive lead of the plurality. The method may further include encapsulating with a molding compound the semiconductor die, a portion of the leadframe, the conductive connector, and the bond wire. The attaching the semiconductor die may include attaching the semiconductor to the flag by way of a die attach material disposed between the semiconductor die and the flag. The die attach material may be characterized as a conductive die attach material having a melting point. The conductive connector may be characterized as a solder-based material having a melting point lower than the melting point of the die attach material. The method may further include a conductive fillet formed at the semiconductor die to flag transition, the conductive connector directly contacting the conductive fillet. The conductive fillet may be formed from a material different from the die attach material.

In yet another embodiment, there is provided, a method including attaching a semiconductor die to a flag of a leadframe; forming a conductive connector over a portion of the semiconductor die and a portion of the flag, a conductive connection between a first bond pad of the semiconductor die and the flag formed by way of the conductive connector; and connecting by way of a bond wire a second bond pad of the semiconductor die to a conductive lead of the plurality, the second bond pad and the first bond pad formed at the same surface of the semiconductor die. The flag may be configured for connection to a ground voltage supply and wherein the first bond pad is characterized as a ground pad. The method may further include forming a conductive fillet at the semiconductor die to flag transition, the conductive fillet formed from a material different from the die attach material, the conductive connector directly contacting the conductive fillet. The attaching the semiconductor die may include attaching the semiconductor to the flag by way of a conductive die attach material having a melting point, and wherein the conductive connector may be characterized as a solder-based material having a melting point lower than the melting point of the die attach material.

By now it should be appreciated that there has been provided, a semiconductor device including a conductive connector formed between a bond pad on a semiconductor die and a flag of the device leadframe. Connecting the bond pad to the flag by way of the conductive connector allows for a ground voltage to be provided to the semiconductor die without using a bond wire, for example. Because ground connections can be made in this manner, an increased number of ground connections can be made without negatively impacting the number of conductive leads of the device. With the increased number of ground connections, inductance generally associated with bond wire connections is reduced resulting in less noise and improved high frequency performance.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a leadframe having a plurality of conductive leads and a flag;
   a semiconductor die attached to the flag of the leadframe;
   a conductive connector applied over a portion of the semiconductor die and a portion of the flag, a conductive connection between a first bond pad of the semiconductor die and the flag formed by way of the conductive connector; and
   a second bond pad of the semiconductor die connected to a conductive lead of the plurality by way of a bond wire.

2. The semiconductor device of claim 1, further comprising a die attach material disposed between the semiconductor die and the flag.

3. The semiconductor device of claim 2, wherein the die attach material is characterized as an electrically conductive die attach material having a melting point.

4. The semiconductor device of claim 3, wherein the conductive connector is characterized as a solder-based material having a melting point lower than the melting point of the die attach material.

5. The semiconductor device of claim 3, wherein a portion of the die attach material extends beyond the perimeter of the semiconductor die, the conductive connector directly contacting the die attach material.

6. The semiconductor device of claim 2, further comprising a conductive fillet formed at the semiconductor die to flag interface, the conductive connector directly contacting the conductive fillet.

7. The semiconductor device of claim 6, wherein the conductive fillet is formed from a material different from the die attach material.

8. The semiconductor device of claim 1, wherein the conductive connector applied over the portion of the semiconductor die and the portion of the flag is formed by way of a 3-D printing process.

9. The semiconductor device of claim 1, wherein the leadframe is characterized as a quad flat no-lead (QFN) type package leadframe.

10. A method comprising:
    attaching a semiconductor die to a flag of a leadframe;
    forming a conductive connector over a portion of the semiconductor die and a portion of the flag, a conductive connection between a first bond pad of the semiconductor die and the flag being formed by way of the conductive connector; and
    connecting by way of a bond wire a second bond pad of the semiconductor die to a conductive lead of the leadframe.

11. The method of claim 10, further comprising encapsulating with a molding compound the semiconductor die, a portion of the leadframe, the conductive connector, and the bond wire.

12. The method of claim 10, wherein attaching the semiconductor die includes attaching the semiconductor die to the flag by way of a die attach material disposed between the semiconductor die and the flag.

13. The method of claim 12, wherein the die attach material is characterized as an electrically conductive die attach material having a melting point.

14. The method of claim 13, wherein the conductive connector is characterized as a solder-based material having a melting point lower than the melting point of the die attach material.

15. The method of claim 10, further comprising a conductive fillet formed at the semiconductor die to flag interface, the conductive connector directly contacting the conductive fillet.

16. The method of claim 15, wherein the conductive fillet is formed from a material different from the die attach material.

17. A method comprising:
    attaching a semiconductor die to a flag of a leadframe;
    forming a conductive connector over a portion of the semiconductor die and a portion of the flag, a conductive connection between a first bond pad of the semiconductor die and the flag being formed by way of the conductive connector; and
    connecting by way of a bond wire a second bond pad of the semiconductor die to a conductive lead of the leadframe, the second bond pad and the first bond pad being formed at the same surface of the semiconductor die.

18. The method of claim 17, wherein the flag is configured for connection to a ground voltage supply and wherein the first bond pad is characterized as a ground pad.

19. The method of claim 17, further comprising forming a conductive fillet at the semiconductor die to flag interface, the conductive fillet formed from a material different from the die attach material, the conductive connector directly contacting the conductive fillet.

20. The method of claim 17, wherein attaching the semiconductor die includes attaching the semiconductor to the flag by way of an electrically conductive die attach material having a melting point, and wherein the conductive connector is characterized as a solder-based material having a melting point lower than the melting point of the die attach material.

\* \* \* \* \*